United States Patent
Zhang et al.

(10) Patent No.: US 8,722,534 B2
(45) Date of Patent: May 13, 2014

(54) METHOD FOR REDUCING WETTABILITY OF INTERCONNECT MATERIAL AT CORNER INTERFACE AND DEVICE INCORPORATING SAME

(75) Inventors: Xunyuan Zhang, Albany, NY (US); Hoon Kim, Guilderland, NY (US); Vivian W. Ryan, Berne, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/561,195

(22) Filed: Jul. 30, 2012

(65) Prior Publication Data
US 2014/0027910 A1    Jan. 30, 2014

(51) Int. Cl.
*H01L 21/4763*    (2006.01)

(52) U.S. Cl.
USPC ............ 438/653; 257/E21.585; 257/E21.589; 257/E21.199; 257/E21.076; 257/E21.593

(58) Field of Classification Search
USPC .......... 438/653, 637, 617, 453, 622, 628, 630
See application file for complete search history.

(56) References Cited

U.S. PATENT DOCUMENTS

| | | | | |
|---|---|---|---|---|
| 7,365,005 B1 * | 4/2008 | Gadgil | .......................... | 438/637 |
| 7,811,925 B1 * | 10/2010 | Reid et al. | ..................... | 438/622 |
| 2006/0211236 A1 * | 9/2006 | Bureau et al. | ................. | 438/628 |

\* cited by examiner

*Primary Examiner* — Chuong A Luu
*Assistant Examiner* — Rodolfo Fortich
(74) *Attorney, Agent, or Firm* — Amerson Law Firm, PLLC

(57) ABSTRACT

A method for forming an interconnect structure includes forming a recess in a dielectric layer of a substrate, forming a first transition metal layer in the recess on corner portions of the recess, and forming a second transition metal layer in the recess over the first transition metal layer to line the recess. The method further includes filling the recess with a fill layer and annealing the substrate so that the first transition metal layer and the second transition metal layer form an alloy portion proximate the corner portions during the annealing, the alloy portion having a reduced wettability for a material of the fill layer than the second transition metal. Additionally, the method includes polishing the substrate to remove portions of the fill layer extending above the recess.

15 Claims, 5 Drawing Sheets

METHOD FOR REDUCING WETTABILITY OF INTERCONNECT MATERIAL AT CORNER INTERFACE AND DEVICE INCORPORATING SAME

CROSS-REFERENCE TO RELATED APPLICATIONS

Not applicable.

BACKGROUND

The disclosed subject matter relates generally to the field of semiconductor device manufacturing, and more particularly, to a method for reducing wettability of ruthenium liner at corner interface and a device made according to the method.

A conventional integrated circuit device, such as a microprocessor, is typically comprised of many thousands of semiconductor devices, e.g., transistors, formed above the surface of a semi-conductive substrate. For the integrated circuit device to function, the transistors must be electrically connected to one another through conductive interconnect structures. The back end of line (BEOL) is the second portion of integrated circuit fabrication where the individual devices (transistors, capacitors, resistors, etc.) get interconnected with wiring on device. BEOL generally begins when the first layer of metal is deposited on the wafer. It includes contacts, insulating layers (dielectrics), metal levels, and bonding sites for chip-to-package connections. Many modern integrated circuit devices are very densely packed, i.e., there is very little space between the transistors formed above the substrate. Thus, these conductive interconnect structures must be made in multiple layers to conserve plot space on the semiconductor substrate.

The conductive interconnect structures are typically accomplished through the formation of a plurality of conductive lines and conductive plugs, commonly referred to as contacts or vias, formed in alternative layers of dielectric materials formed on the device. As is readily apparent to those skilled in the art, the conductive plugs are means by which various layers of conductive lines, and/or semiconductor devices, may be electrically coupled to one another. The conductive lines that connect the various interconnect structures are commonly formed in trenches defined in the dielectric layers.

A contact is generally used to define an interconnect structure (e.g., using polysilicon or metal) to an underlying polysilicon layer (e.g., source/drain or gate region of a transistor), while a via denotes a metal to metal interconnect structure. In either case, a contact opening is formed in an insulating layer overlaying the conductive member. A second conductive layer is then formed over the contact opening and electrical communication is established with the conductive member.

One technique for reducing the size of the features formed on the semiconductor device involves the use of copper for the lines and interconnections in conjunction with new dielectric materials having lower dielectric constants than previously achievable with common dielectric material choices. Standard dielectric materials such as silicon dioxide, TEOS, and F-TEOS have dielectric constants greater than 3. The new dielectric materials, commonly referred to as low-k dielectrics, have dielectric constants less than 3, and thus, allow greater device densities, due to their more efficient isolation capabilities. One suck low-k dielectric is sold under the name of Black Diamond, by Applied Materials, Inc.

Typical interconnect features include a barrier layer for inhibiting electromigration and a seed layer to provide a starting template for the bulk copper fill needed to complete the interconnect. Due to continuous scaling to smaller dimensions, the fabrication process for BEOL metal features must be tightly controlled to address geometries on a scale of sub-nanometers. Ruthenium (Ru) has been proposed as a seed enhancement layer to improve the copper seed coverage, thereby enhancing the copper fill. A ruthenium layer allows direct copper plating, but copper wettability on ruthenium is so good that there is no copper recess at the interface of copper and ruthenium at the upper outer corners of the metal features. These regions, referred to as "triple points" can have a negative impact on reliability. The copper may be at the same height as the ruthenium liner, or the copper can even creep over the top of the ruthenium and migrate along the interlayer-dielectric interface thus inducing early failures.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF EMBODIMENTS

The following presents a simplified summary of only some aspects of embodiments of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method for forming an interconnect structure. The method includes forming a recess in a dielectric layer of a substrate. A first transition metal layer is formed in the recess on corner portions of the recess. A second transition metal layer is formed in the recess over the first transition metal layer to line the recess. The recess is filled with a fill layer. The substrate is annealed. The first transition metal layer and the second transition metal layer form an alloy portion proximate the corner portions during the annealing. The alloy portion has a lower wettability for a material of the fill layer than the second transition metal. The substrate is polished to remove portions of the fill layer extending above the recess.

Another aspect of the disclosed subject matter is seen in a semiconductor device including a recess having a corner portion defined in a dielectric layer, and an interconnect structure defined in the recess. The interconnect structure includes an alloy of a first and second transition metal disposed on the corner portion, a layer of the second transition metal lining sidewall portions of the recess, and a fill material substantially filling the recess. The second transition metal has a higher wettability for the fill material than the alloy.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
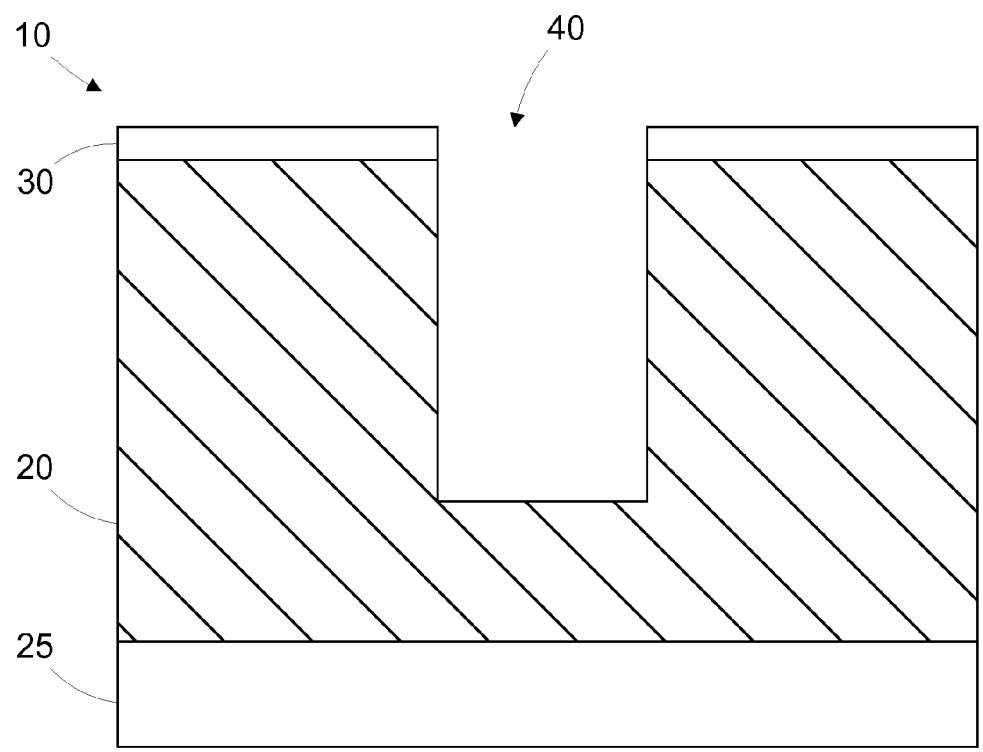
FIG. 1 is a cross section view of a partially completed interconnect structure.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the disclosed subject matter shall be described in the context of a method for fabricating an interconnect structure. FIG. 1 is a cross-section view of a partially completed interconnect structure 10. A dielectric layer 20 has been provided on a substrate 25. The dielectric layer may represent an interlayer dielectric layer disposed between a device layer or metallization layer and another metallization layer. In one embodiment, the dielectric layer 20 may have a low dielectric coefficient, commonly referred to as a low-k dielectric. One such suitable low-k dielectric material is Black Diamond, offered by Applied Materials, Inc. A hard mask layer 30 is formed to provide a template for etching a recess 40. In the illustrated embodiment, the recess 40 is a trench in which an interconnect line feature is being formed, however, the methods described herein may also be applied to other types of interconnects, such as via structures or dual damascene trench and via structures, where an underlying metal region is being contacted by the interconnect feature. Hence, the recess 40 may be a trench, a via opening, or a combined trench and via opening.

Figure 2:
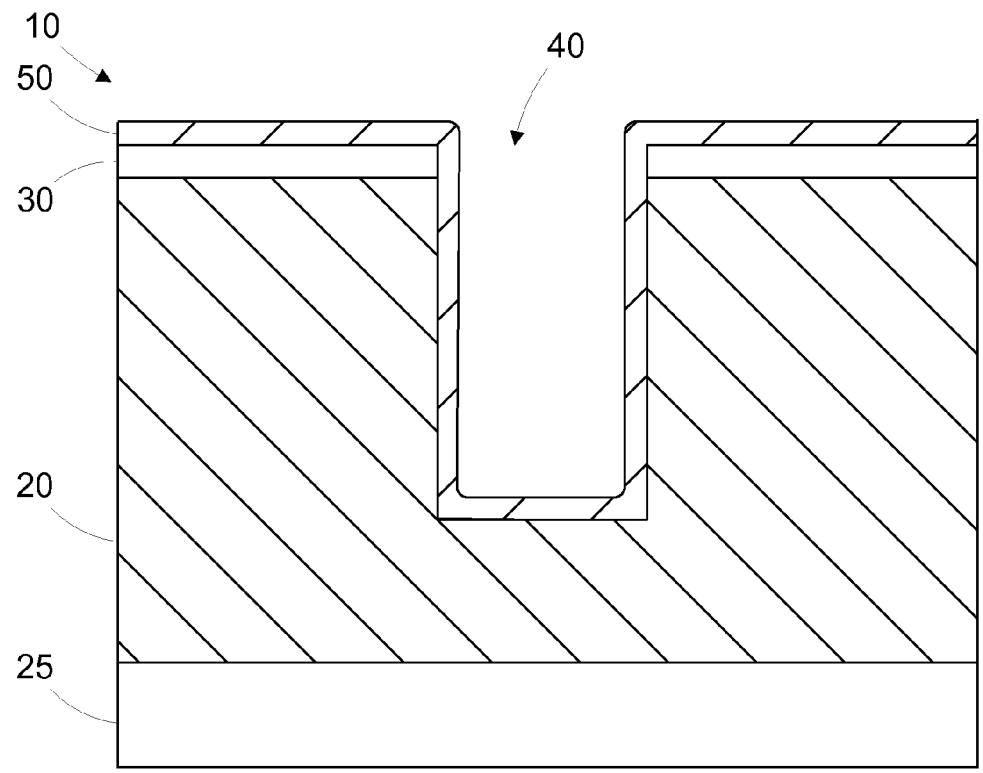
FIG. 2 is a cross-section view of the structure of FIG. 1 illustrating the formation of a barrier layer.

As illustrated in FIG. 2, a barrier layer 50 is formed to line the recess 40. The barrier layer 50 serves to constrain the copper used to eventually fill the recess 40 so that it does not move into the dielectric layer 20. Exemplary barrier materials include tantalum nitride (TaN), which may be formed by physical vapor deposition (PVD) or atomic layer deposition (ALD) processes known in the art.

Figure 3:
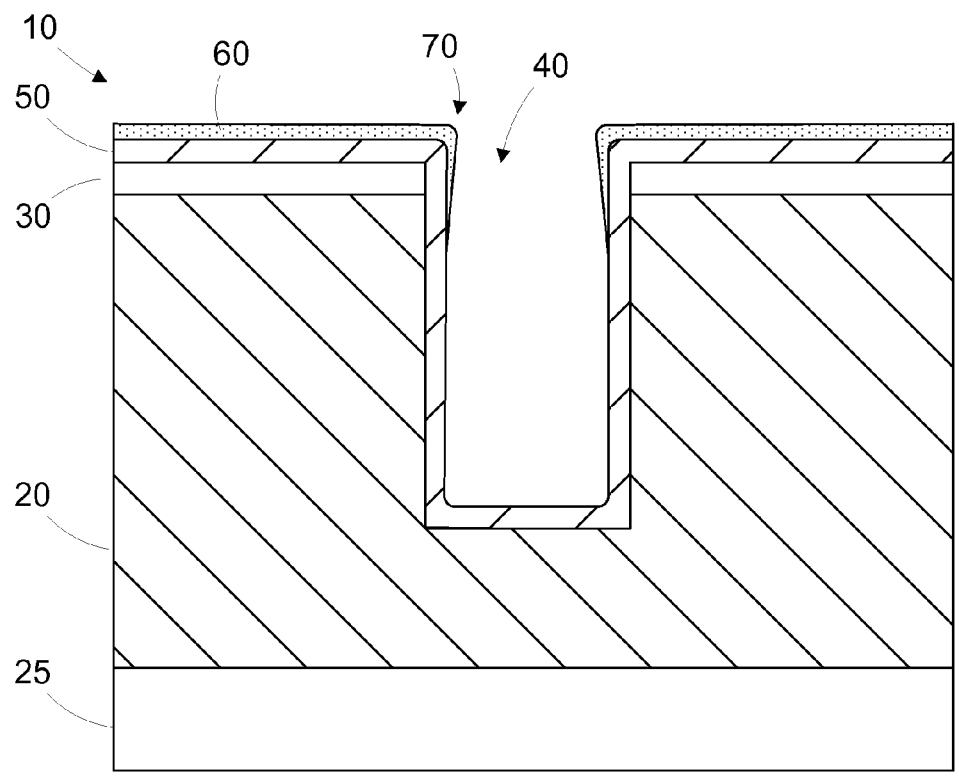
FIG. 3 is a cross-section view of the structure of FIG. 2 illustrating the formation of a transition metal layer at corners of the interconnect structure.

As illustrated in FIG. 3, a first transition metal layer 60 is formed on upper corners 70 of the recess 40 above the barrier layer 50. Exemplary transition metals could include any element in the d-block of the periodic table, which includes groups 3 to 12 on the periodic table. In the illustrated embodiment, titanium (Ti) is used to form the first transition metal layer 60. A plasma assisted PVD process may be employed without a bias voltage to form the first transition metal layer 60 on the corners 70. In some embodiments, a CVD process may be employed as an alternative to the PVD process. Because of the aspect ratio of the recess 40, the transition metal layer 60 does not substantially cover the sidewall or bottom portions of the recess 40. Stray particles of the transition metal may be formed on the sidewall or bottom portions, but due to the lack of bias voltage to attract the particles to the bottom, the transition metal layer 60 is concentrated at the corners 70. In one embodiment, the thickness of the transition metal layer 60 is about 5 to 30 angstroms.

Figure 4:
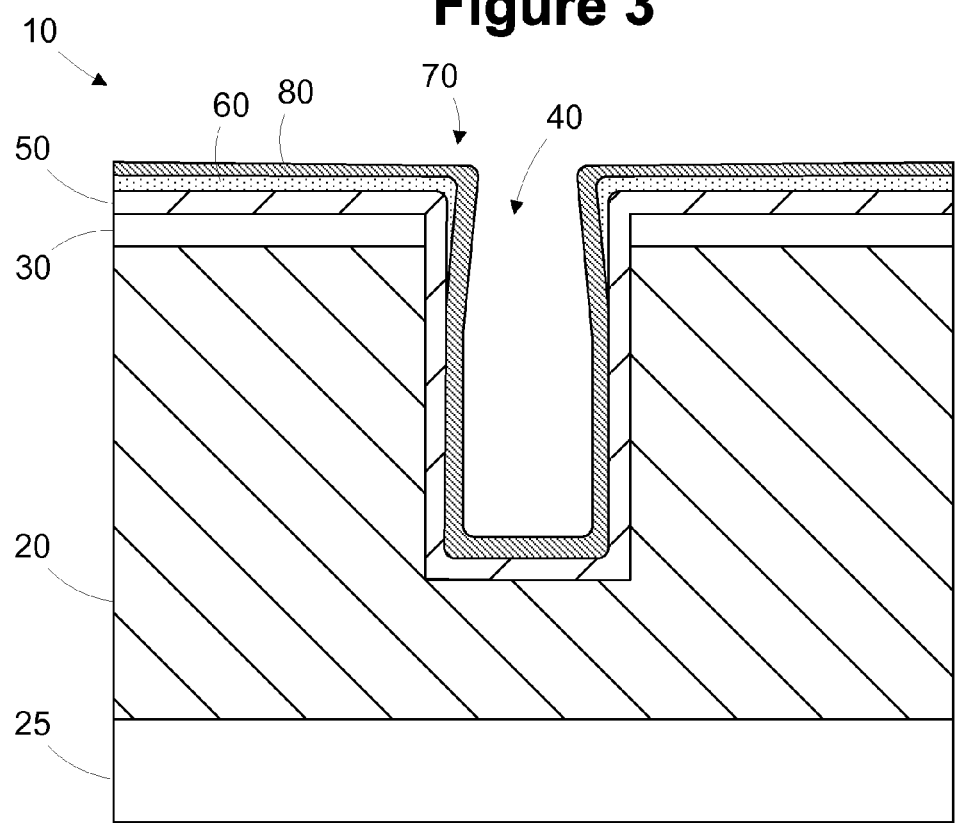
FIG. 4 is a cross-section view of the structure of FIG. 3 illustrating the formation of a ruthenium layer.

A second transition metal layer 80 (i.e., any of the d-block metals) having a copper wettability greater than the first transition metal layer 60 is formed using a chemical vapor deposition process in FIG. 4. In the illustrated embodiment, the second transition metal layer is ruthenium (Ru), but other transition metals having relatively high wettabilities that may be used are osmium, rhodium, palladium, platinum, iridium, and niobium. In one embodiment, the thickness of the second transition metal layer 80 is about 10 to 25 angstroms.

Figure 5:
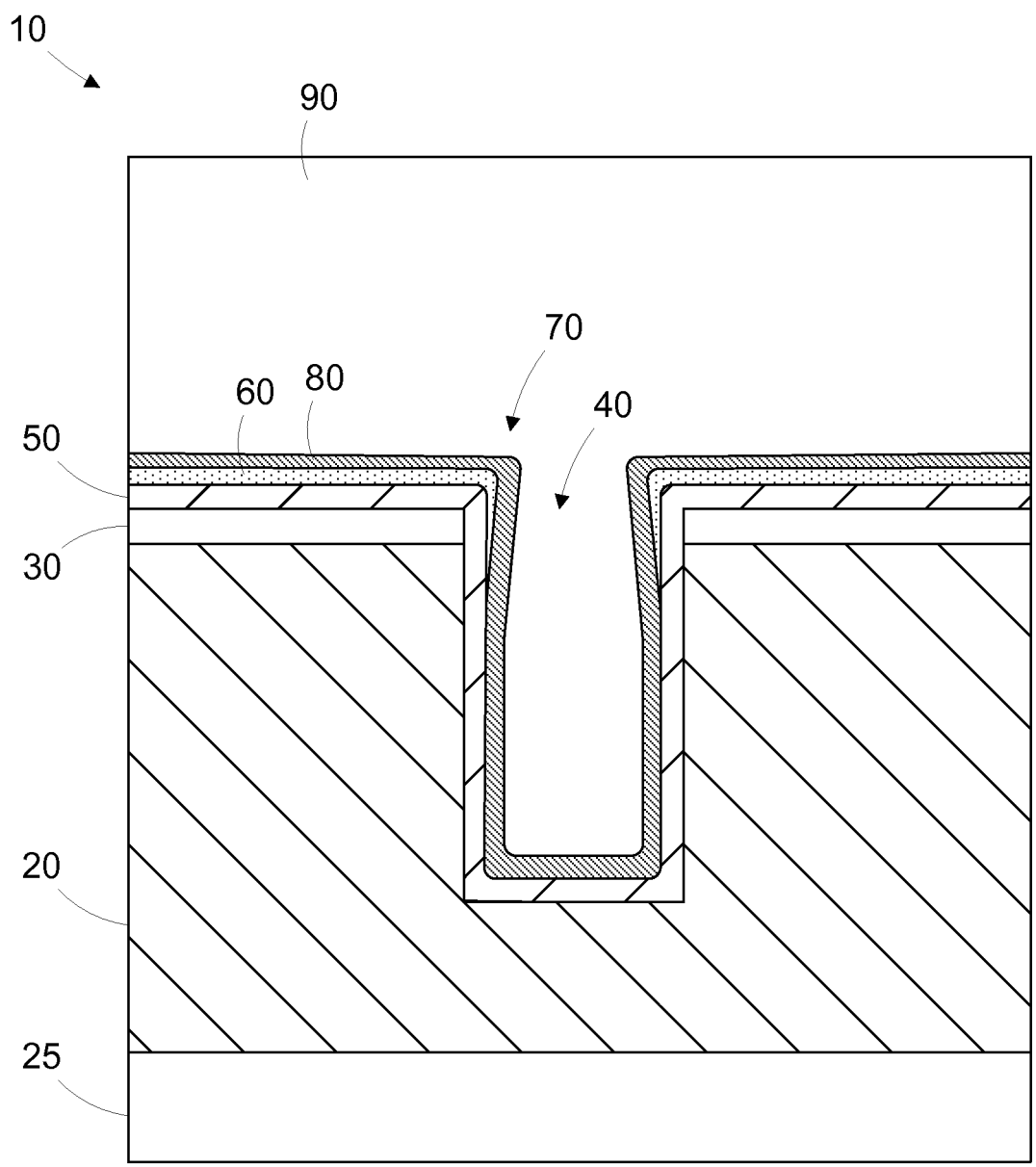
FIG. 5 is a cross-section view of the structure of FIG. 4 illustrating a copper fill process.

The second transition metal layer 80 fully lines the recess 40, and provides a wettable surface for a subsequent copper fill. In FIG. 5, a copper seed layer (not visible) is formed and the bulk copper fill is performed to form copper fill layer 90.

Figure 6:
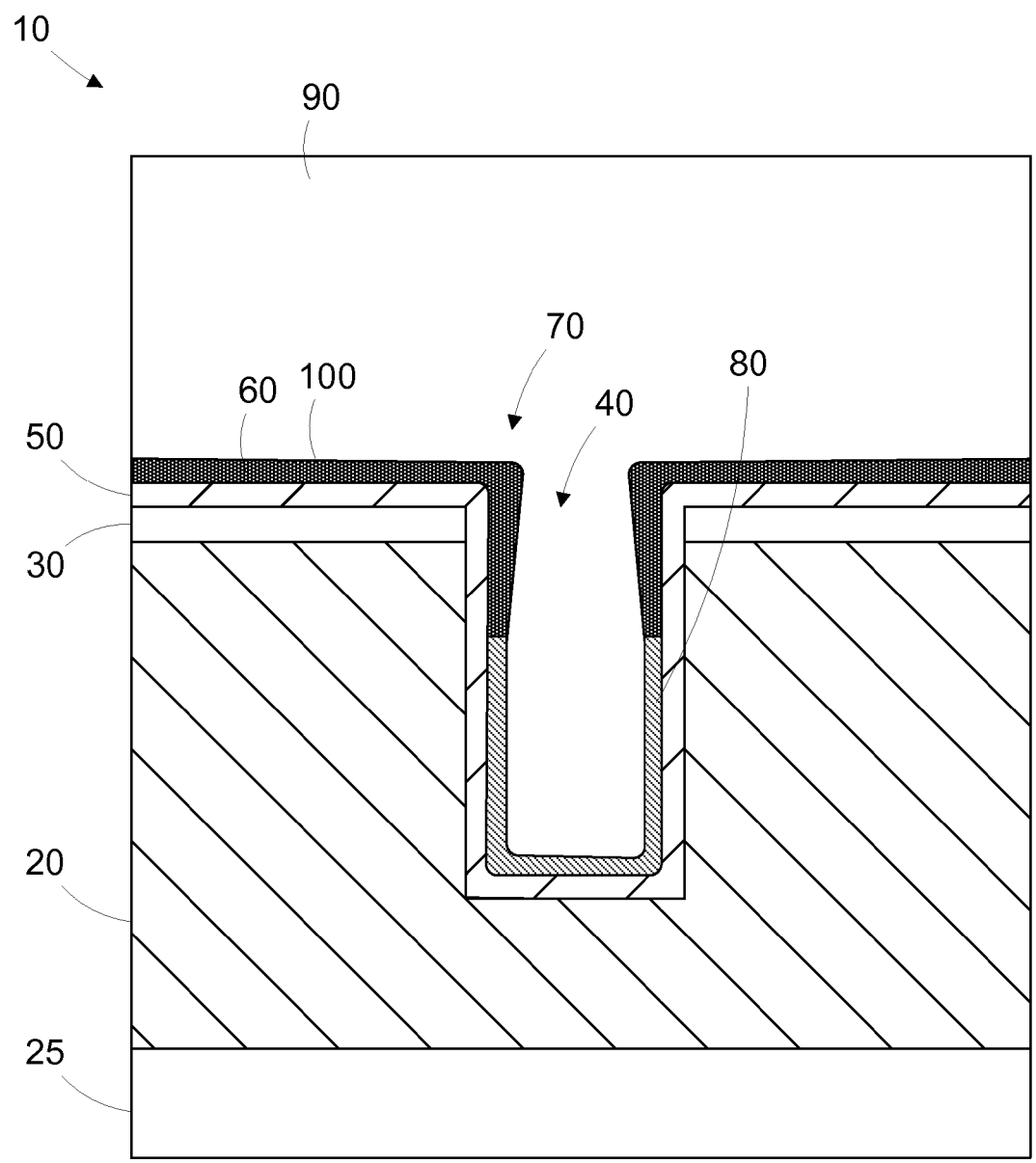
FIG. 6 is a cross-section view of the structure of FIG. 5 illustrating a copper anneal process to form alloy regions at the corners.
Figure 7:
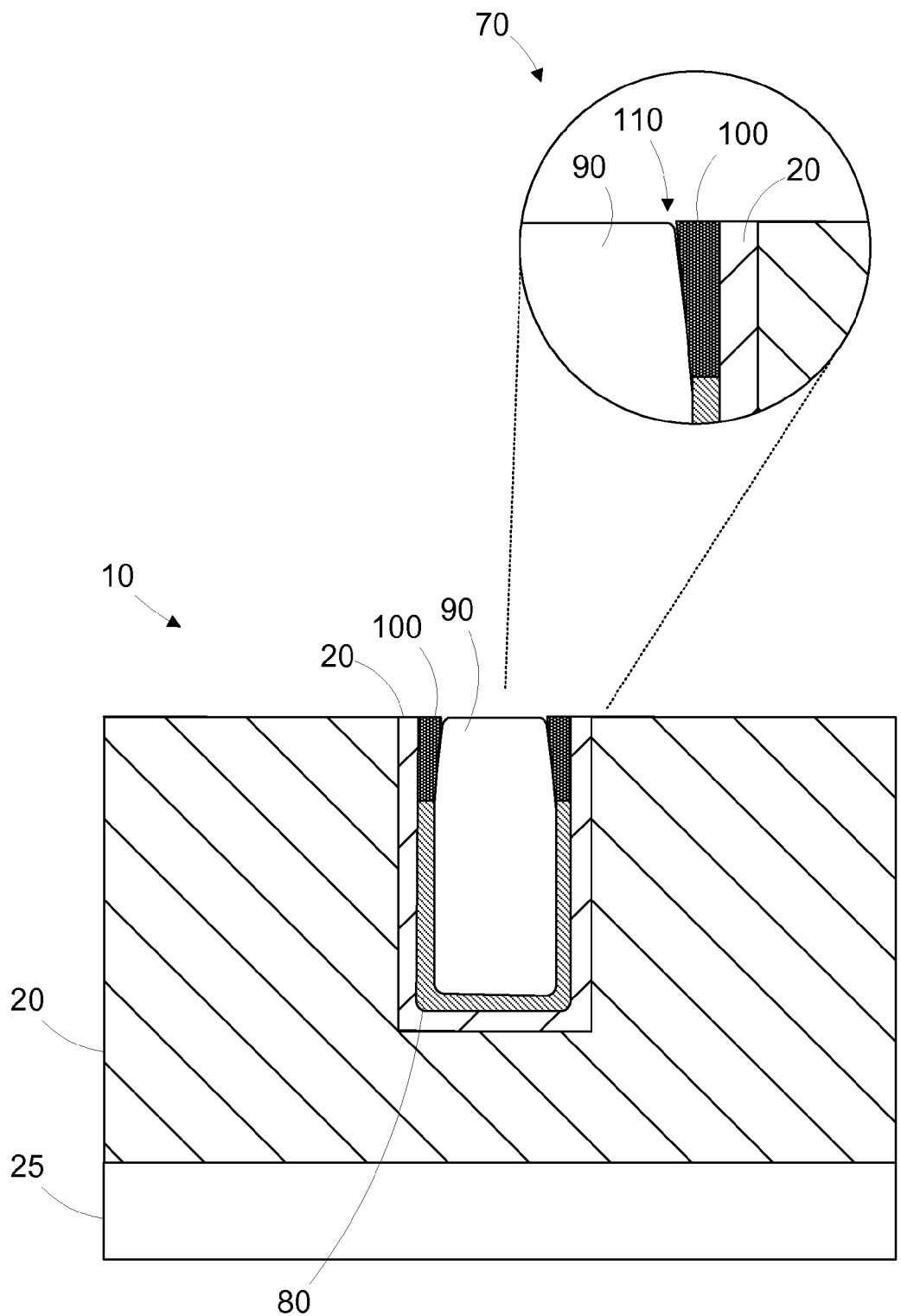
FIG. 7 is a cross-section view of the structure of FIG. 6 illustrating a polishing process to remove excess copper and recess the copper at the corners.

In FIG. 6, an anneal process is performed to realign the grain boundaries and increase the grain size of the copper layer 90. During the anneal process, the first transition metal layer 60 forms an alloy layer 100 in the corner regions 70 with the second transition metal layer 80. In one embodiment, the anneal may be performed at temperatures between about 100-400° C. for about 0.5 to 2.0 hr. Subsequently, a chemical mechanical polishing (CMP) process is performed to remove excess copper fill material 90. During the polishing process the horizontal portions of the alloy layer 100, the barrier layer 50, and the hard mask layer 30 are removed, resulting in the structure shown in FIG. 7.

The alloy layer 100 has a reduced wettability as compared to the second transition metal layer 80. The first transition metal in the alloy layer 100 forms an oxide at the corner interface (e.g., $TiO_x$). The oxide causes the copper layer 90 to dewet at the corner interface 70. Crevices 110 are generated at the corners 70 due to the stress assisted etch used to perform the CMP process, thereby recessing the copper 90 at the corners 70. The crevices 110 isolate the copper 90 from the triple point of the interconnect structure 10

The use of the second transition metal layer 80 allows an improved copper fill by increasing wettability. The formation of the alloy layer 100 during the copper anneal provides reduced wettability in the corner regions 70 during the CMP process, thereby recessing the copper 90. The recessed copper 90 improves the time-dependent dielectric breakdown (TDDB) reliability of the interconnect structure 10, because the poor copper wettability at the trench edge retards copper diffusion to the dielectric surface, which degrades reliability.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
    forming a recess in a dielectric layer of a substrate, said recess having corner portions adjacent an upper surface of said dielectric layer and sidewalls having a substantially vertical length;
    forming a first transition metal layer in the recess above said corner portions of the recess and above a portion, but not all, of said vertical length of said sidewalls of said recess;
    forming a second transition metal layer in the recess over the first transition metal layer to line the recess;
    filling the recess with a fill layer;
    annealing the substrate, wherein the first transition metal layer and the second transition metal layer form an alloy portion proximate at least the corner portions during the annealing, wherein the alloy portion has a reduced wettability for a material of the fill layer than the second transition metal; and
    polishing the substrate to remove portions of the fill layer extending above the recess.

2. The method of claim 1, wherein the fill layer comprises copper.

3. The method of claim 1, wherein filling the recess comprises forming a seed layer over the second transition metal layer and forming material of the fill layer over the seed layer.

4. The method of claim 1, wherein the second transition metal layer comprises ruthenium.

5. The method of claim 4, wherein the first transition metal layer comprises titanium.

6. The method of claim 1, wherein polishing the wafer results in the formation of a recess between the fill layer and the alloy portion proximate the corner portion.

7. The method of claim 1, wherein the first transition metal is substantially absent from bottom portions of the recess.

8. The method of claim 1, further comprising forming a barrier layer in the recess prior to forming the first transition metal layer.

9. The method of claim 8, wherein the barrier layer comprises tantalum nitride.

10. The method of claim 1, wherein the recess comprises a trench.

11. The method of claim 1, wherein the recess comprises a via opening.

12. A method, comprising:
    forming a recess in a dielectric layer of a substrate, said recess having corner portions adjacent an upper surface of said dielectric layer and sidewalls having a substantially vertical length;
    forming a titanium layer in the recess above said corner portions of the recess and above a portion, but not all, of said vertical length of said sidewalls of said recess;
    forming a ruthenium layer over the titanium layer to line the recess;
    filling the recess with copper;
    annealing the substrate, wherein the titanium layer and the ruthenium layer form an alloy portion proximate the corner portions during the annealing; and
    polishing the substrate to remove portions of the copper extending above the recess.

13. The method of claim 12, further comprising forming a barrier layer in the recess prior to forming the titanium layer.

14. The method of claim 1, wherein forming said first transition metal layer comprises performing a plasma assisted physical vapor deposition process without a bias voltage to form said first transition metal layer.

15. The method of claim 12, wherein forming said titanium layer comprises performing a plasma assisted physical vapor deposition process without a bias voltage to form said titanium layer.

* * * * *